United States Patent [19]

Bergami et al.

[11] Patent Number: 4,855,804
[45] Date of Patent: Aug. 8, 1989

[54] MULTILAYER TRENCH ISOLATION PROCESS AND STRUCTURE

[75] Inventors: Bridgette A. Bergami, Gilbert; Phillip H. Williams, Mesa, both of Ariz.

[73] Assignee: Motorola, Inc., Schaumburg, Ill.

[21] Appl. No.: 271,145

[22] Filed: Nov. 14, 1988

Related U.S. Application Data

[62] Division of Ser. No. 122,091, Nov. 17, 1987, abandoned.

[51] Int. Cl.$^4$ .................... H01L 27/12; H01L 29/06; H01L 29/34
[52] U.S. Cl. ........................................ 357/49; 357/55; 357/54
[58] Field of Search ............... 357/49, 55, 54; 437/67; 156/646

[56] References Cited

U.S. PATENT DOCUMENTS

| | | | |
|---|---|---|---|
| 3,883,889 | 5/1975 | Hall | 357/73 |
| 4,454,646 | 6/1984 | Joy et al. | 29/576 |
| 4,454,647 | 6/1984 | Joy et al. | 29/576 |
| 4,471,525 | 9/1984 | Sasaki | 29/576 |
| 4,571,819 | 2/1986 | Rogers et al. | 29/576 |
| 4,580,330 | 4/1986 | Pollack et al. | 29/576 |
| 4,582,565 | 4/1986 | Kawakatsu | 156/643 |
| 4,589,193 | 5/1986 | Goth et al. | 29/576 |
| 4,621,414 | 11/1986 | Iranmanesh | 29/576 |

FOREIGN PATENT DOCUMENTS 59-182538 10/1984 Japan .
59181640 10/1984 Japan .
59-193044 11/1984 Japan .

OTHER PUBLICATIONS

Gaind et al, "Physicochemical Properties of Chemical Vapor-Deposited Siliconoxynitride from a SiH$_4$-CO$_2$-NH$_3$-H$_2$ System, J. Electrochem Solid state Science and Technology", vol. 225, No. 1, pp. 139-145.
Ghandi et al., "VLSI Fabrication Principles", ©1983 (Jan. 6) by John Wiley & Sons Inc.

Primary Examiner—Rolf Hille
Assistant Examiner—Robert P. Limanek
Attorney, Agent, or Firm—Joe E. Barbee; Bob Handy

[57] ABSTRACT

Dielectric filled isolation walls for semiconductor devices and integrated circuits of improved characteristics and ease of manufacture are formed by etching trenches in a semiconductor substrate and refilling the trenches with multiple layers of silicon oxy-nitride. Alternative oxygen rich and nitrogen rich oxy-nitride layers are used. For the narrowest trenches two layers suffice. Where trenches of different widths are present the wider trenches receive multiple layer pairs. A cap layer of oxy-nitride is added to insure filling of any trench intersections. The oxy-nitride desirably has a composition $Si_xO_yN_z$ where x, y, and z are in the range of 0.25-0.4, 0.27-0.6, and 0.0-0.35, respectively, for the oxygen rich material and where x, y, and z are in the range 0.35-0.43m 0.0-0.35, and 0.28-0.6, respectively, for the nitrogen rich material, expressed in atomic fraction and x+y+z=1. Both compositions of oxy-nitride are formed in the same LPCVD reactor by changing the conditions during layer deposition.

22 Claims, 4 Drawing Sheets

MULTILAYER TRENCH ISOLATION PROCESS AND STRUCTURE

This is a division of application Ser. No. 122,091, filed Nov. 17, 1987, now a abandoned.

BACKGROUND OF THE INVENTION

This invention relates in general to semiconductor devices and, more particularly, to a means and method for providing an insulating isolation wall for electrically isolating one portion of an integrated semiconductor device structure or circuit from another. The isolation wall is formed in a trench provided in the semiconductor substrate.

The copending application by Robert Mattox et al., Ser. No. 07/122,086, entitled "Trench Isolation Process and Structure", and the copending application of Andrew G. Nagy et al.,, Ser. No. 07/122,094, now U.S. Pat. No. 4,791,073 entitled "Trench Isolation Method for Semiconductor Devices", are related and are incorporated herein by reference.

It is common place to provide isolation walls between adjacent devices or device regions in integrated circuits, particularly bipolar integrated circuits. In the prior art these isolation walls have been formed of a dielectric such as silicon dioxide or a combination of silicon dioxide and polycrystalline silicon. A disadvantage of using thermally grown silicon dioxide for the isolation walls is that oxide growth progresses laterally as well as vertically making achievement of small lateral dimensions and precise dimensional control more difficult. In addition, trapped voids are frequently formed when oxide is used, particularly in trenches whose depth is equal to or larger than their width.

Further, silicon dioxide, which is the most commonly used trench refill material, whether grown or deposited, has a different coefficient of thermal expansion than most semiconductor substrates. As a consequence, when the semiconductor wafer is heated and cooled during processing, the differential thermal expansion can induce great stress in the semiconductor substrate. This leads to defect formation in the substrate adjacent to the isolation wall, which is undesirable.

It is known in the prior art to replace part of the dielectric of the isolation wall with a polycrystalline semiconductor of the same material as the substrate. The poly region is isolated from the substrate by a thin oxide region on the sides of the trench or is doped so as to form a PN junction with the single crystal semiconductor substrate or both. While the use of such a poly plug in the isolation wall trench can reduce the differential thermal expansion mismatch, it creates other problems well known in the art.

As described in the copending applications by Mattox et al., and Nagy et al., noted above, the thermal mismatch and other problems can be overcome by use of an oxynitride trench filling material. However, some problems still remain, particularly where trenches of different widths must be consistently filled on the same substrate in a manner which avoides cracks, crevices, voids and lack of planarity, independent of trench width.

Accordingly, it is an object of the present invention to provide an improved means and method for isolation walls for semiconductor devices and integrated circuits.

It is an additional object of the present invention to provide an improved means and method for isolation walls for semiconductor devices and integrated circuits having isolation walls of different widths in the same wafer.

It is a further object of the present invention to provide an improved means and method for isolation walls for semiconductor devices and integrated circuits having isolation walls of different widths in the same wafer, wherein the dielectric filling in the isolation trenches is formed in a single reactor.

It is an additional object of the present invention to provide an improved means and method for isolation walls for semiconductor devices and integrated circuits having isolation walls of different widths in the same wafer, wherein mid-trench crevices or gaps are avoided.

It is a further object of the present invention to provide an improved means and method for isolation walls for semiconductor devices and integrated circuits having isolation walls of different widths in the same wafer, wherein the dielectric filling the isolation trenchs has a controlled and minimal differential thermal expansion relative to the substrate, independent of trench width.

It is an additional object of the present invention to provide an improved means and method for isolation walls for semiconductor devices and integrated circuits employing isolation walls of different widths in the same wafer, wherein the foregoing objectives are achieved simultaneously.

SUMMARY OF THE INVENTION

The foregoing and other objects and advantages are provided by the means and method of the present invention wherein a semiconductor substrate having an upper surface and having trenches extending from the surface into the substrate is provided, a thin base dielectric layer that is differentially etchable with respect to the substrate is optionally provided on the surface and the walls of the trenches, a first dielectric layer of a first predetermined thickness and coefficient of expansion is provided on the base layer, or optionally directly on the substrate surface and/or the trench walls, and a second dielectric layer of a second predetermined thickness and coefficient of expansion is provided on the first layer, wherein the first and second thicknesses are adjusted so that together they fill the narrowest trench.

Where the substrate contains additional wider trenches, a third and fourth layer of, respectively, the same materials as the first and second layers are provided, having, respectively, third and fourth thicknesses, wherein the third and fourth thicknesses are adjusted in combination with the first and second thicknesses to fill the next wider trench.

Where the substrate contains still wider trenches, fifth and sixth layers analogous to the first and second, and third and fourth layers, are provided, respectively, of a fifth and sixth thickness sufficient in combination with the first through fourth thicknesses to fill the next still wider trench. Additional layer pairs may be provided to accommodate still wider trenches. A cap layer is desirable provided over the last layer pair. This is helpful in completing filling of trench intersections.

It is desirable that the odd numbered layers be of the same first material and that the even numbered layers be of the same second material and that the first and second materials be different. The cap layer is desirably of the same class of materials as the first and second material. It is desirable that the odd numbered layers be thicker than the even numbered layers.

Where the successively wider trenches have widths that are integral multiples of the narrowest trench width, it is desirable that the odd numbered layers have about equal first thicknesses and that the even numbered layers have about equal second thicknesses.

An oxygen rich silicon oxy-nitride is preferred for the odd numbered layers and a nitrogen rich silicon oxy-nitride for the even numbered layers. Both layers are conveniently formed by low pressure chemical vapor deposition (LPCVD) in the same reactor by varying the reactant gas composition during deposition.

Where the oxy-nitride composition is expressed as $Si_xO_yN_z$ with x, y, and z being atomic fractions, the oxygen rich oxy-nitride material has the ratio y/z greater than one and less than infinity and the nitrogen rich oxy-nitride material has the ratio z/y greater than one and less than infinity. More particularly it is desirable that the oxygen rich oxy-nitride also has about $x=0.25-0.4$, $y=0.27-0.6$, and $z=0.0-0.35$ and the nitrogen rich oxy-nitride also has about $x=0.34-0.43$, $y=0.0-0.35$ and $z=0.28-0.6$, expressed in atomic fractions. It is preferable that the oxygen rich oxy-nitride has about $x=0.3-0.35$, $y=0.4-0.5$, and $z=0.17-0.25$ and the nitrogen rich oxy-nitride also has about $x=0.38-0.41$, $y=0.13-0.23$ and $z=0.32-0.46$. In terms of the refractive index of the oxy-nitride layers, the oxygen rich oxy-nitride desirably has a refractive index in the range about 1.45–1.68 and the nitrogen rich oxy-nitride desirably has a refractive index in the range about 1.68–2.01.

A more complete understanding of the present invention along with further advantages thereof can be attained from the following description in conjunction with the attached drawings.

DETAILED DESCRIPTION OF THE FIGURES

Figure 1:
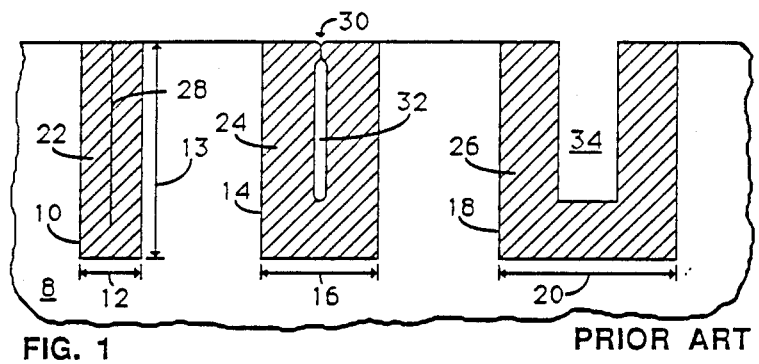
FIG. 1 shows a simplified cross-secontional view of a portion of a semiconductor substrate containing three isolation walls of different widths formed in the substrate and according to the prior art.

FIG. 1 is a simplified schematic cross-section of a portion of a semiconductor substrate containing three isolation walls of different widths and according to the prior art. Substrate 8 has therein narrowest trench 10 of width 12, wider trench 14 of width 16 and widest trench 18 of width 20. For simplicity trenches 10, 14, 18 are shown as having the same depth 13, but this is not essential. Prior art Trenches 10, 14, 18 are filled, respectively, in varying degrees by trench filling materials 22, 24, 26 usually of dielectric such as silicon dioxide but sometimes of polycrystalline semiconductor such as for example polysilicon, with or without a dielectric trench wall liner.

Figure 2:
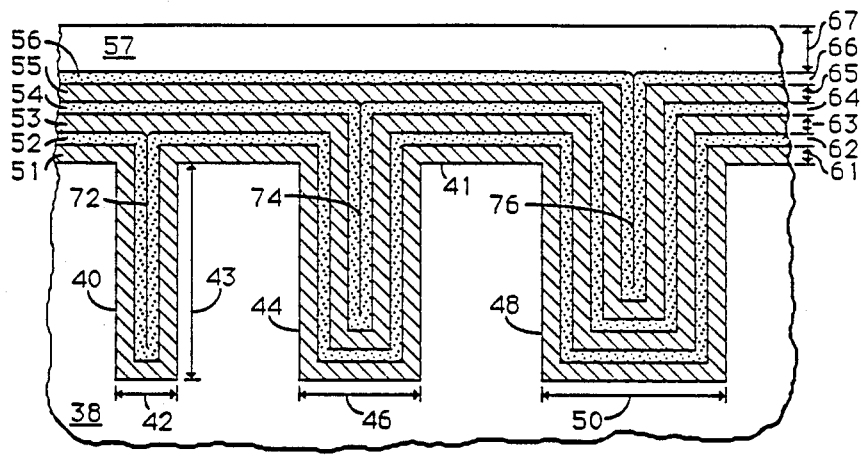
FIGS. 2–3 show simplified cross-sectional views of a semiconductor substrate containing three isolation walls of different widths formed in trenches in the substrate according to the present invention and during different stages of fabrication.
Figure 3:
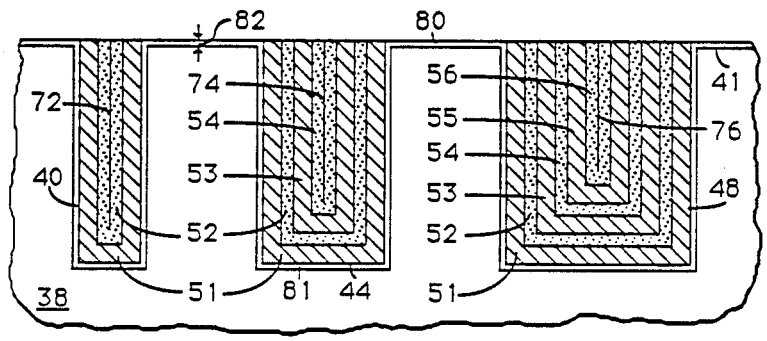

The device regions, e.g., transistors, resistors, diodes, contacts and the like (not shown), which are normally located between and isolated by trenches 10, 14, 18 of FIG. 1 and by trenches 40, 44, 48 of FIGS. 2–3 are not a part of this invention and are omitted here for simplicity. Those of skill in the art will understand how such devices and device regions are formed in conjunction with the trenches described herein.

Referring again to FIG. 1, narrowest trench 10 is completely filled with, for example, silicon oxide deposited by low temperature chemical vapor deposition (LPCVD) or other methods well known in the art. Seam 28, centrally located in trench 10, forms where the outer surfaces of filling 22 grow together. For most materials used for refilling trenches, seam 28 is particularly etch sensitive and a void or crevice (not shown) often forms around seam 28 during subsequent processing. This is undesirable.

Wider trench 14 illustrates the situation which is common with oxide filled trenches where trapped void 32 has formed within trench filling material 24. This occurs when the upper corners of the trench filling material meet at 30 before the lower portions of the trench have completely filled. This situation is common with many trench filling materials where deposition of the trench filling material is not highly conformal or the trench sidewalls are concave (i.e., narrower at the top) or both.

Widest trench 18 illustrates the prior art situation where filling material 26 has been deposited thick enough to fill narrower trenches 10, 14 but not sufficiently thick to fill widest trench 18. Large gap 34 still remains in trench 18 which must be filled later in the process by, for example, a separate planarization step. Gap 34 often occurs where multiple width trenches must be provided on the same substrate and where other constraints such as layer delamination or substrate cracking or formation of crystallographic slippage defects in the substrate or the like, prevent use of sufficiently thick materials during trench refill. Gap 34 is undesirable.

These and other difficulties with prior art structures and methods are avoided by the means and method of the present invention illustrated in FIGS. 2–3. FIGS. 2–3 are cross-sections similar to FIG. 1 but according to the present invention and during different stages of fabrication.

Referring now to FIG. 2, semiconductor substrate 38 having principal surface 41, has formed therein narrowest trench 40 of width 42, wider trench 44 of width 46 and widest trench 48 of width 50. Trenches 40, 44, 48 are shown as having common depth 43, but this is merely for simplicity of explanation and is not essential. Surface 41 of substrate 38 and the walls of trenches 40, 44, 48 are conformally covered by first dielectric layer 51 of thickness 61. First layer 51 is then conformally covered by second dielectric layer 52 of thickness 62. Thicknesses 61 and 62 are chosen so that the combination of layers 51 and 52 at least completely fills narrowest trench 40. Under these circumstances, the outer surface of layer 52 forming on layer 51 on the left wall of trench 40 in FIG. 2 meets the outer surface of layer 52 forming on layer 51 on the right wall of trench 40 in FIG. 2, at location 72.

It is important that the inward growing surfaces of layer 52 not merely just touch at location 72, but make a chemical bond so that the material of layer 52 at location 72 has substantially the same physical and chemical properties as the bulk of layer 52. In particular, it is important that the joint in layer 52 at 72 not be substantially more sensitive to etching than the remainder of layer 52 since, if it is more etch sensitive, then a narrow gap or crevice will often form at location 72 during subsequent manufacturing steps associated with device formation in substrate 38. Such gaps or crevices are undesirable. As will be explained later, by the proper choice of material for layer 52, an etch insensitive joint can be formed in layer 52 at location 72.

If substrate 38 only contained trenches of width 42, then filling of the trenches would be complete and the process could proceed to the next steps, i.e., adding a cap layer of the first, second, or other material and then planarizing the combination of the trench filling materials and the cap layer. However, where trenches of greater width are also present in the substrate, further trench filling depositions are desirable to insure that the situation illustrated by gap 34 in trench 18 of FIG. 1 does not occur.

Referring again to FIG. 2, third layer 53 of thickness 63 is formed on second layer 52 and fourth layer 54 of thickness 64 is formed on third layer 53. Thicknesses 63 and 64 are adjusted in conjunction with thicknesses 61 and 62 so that the sum of thicknesses 61, 62, 63 and 64 is at least sufficient to fill trench 44, with the outer surface of layer 54 meeting at location 74 in trench 44 in the same manner as for layer 52 in trench 40. The same conditions apply concerning the bonding of the outer surface of layer 54 at location 74 as were discussed in connection with the bonding of the outer surface of layer 52 at location 72.

Where still wider trench 48 is present in substrate 38, fifth layer 55 of thickness 65 is provided on layer 54 and sixth layer 56 of thickness 66 is provided on layer 55 in the same manner as before. Thicknesses 65, 66 are adjusted in combination with thicknesses 61, 62, 63, and 64 to be sufficient to at least fill trench 48 with the outer surface of layer 56 bonding at location 76 in the same manner as previously described for the bonding of the outer layers meeting at locations 72, 74. Additional layer pairs may be provided to complete filling of still wider trenches or trench intersections.

It is desirable that the structure be covered with final cap layer 57 to assist in planarization. Cap layer 57 is conveniently of a material of the same class as that used for the layer pairs, i.e., a refractory oxide, nitride or oxy-nitride, and preferably produced in the same reactor without interruption of the process. The material used for odd numbered layers 51, 53, 55, etc., is suitable but silicon oxides, silicon oxy-nitrides, silicon nitrides and other materials may also be used. Doped glasses and flowable glasses are examples of further alternative materials for cap layer 57. These can be applied by sputtering, LPCVD or spin-on techniques well known in the art.

Layers 51–57 are conveniently formed by chemical vapor deposition, preferably by LPCVD, but other deposition methods well known in the art, e.g., sputtering, will also serve. It is important that the deposition or reaction method chosen for forming layers 51–56 provide substantially conformal deposition to avoid the formation of trapped voids. It is also desirable in this regard that the trenches either have substantially vertical sides or convex sides, preferably sides which lean outward from the bottom of the trench toward the substrate surface, rather than sides which are concave, that is, closer together at the trench opening or top than elsewhere in the trench.

Figure 4A:
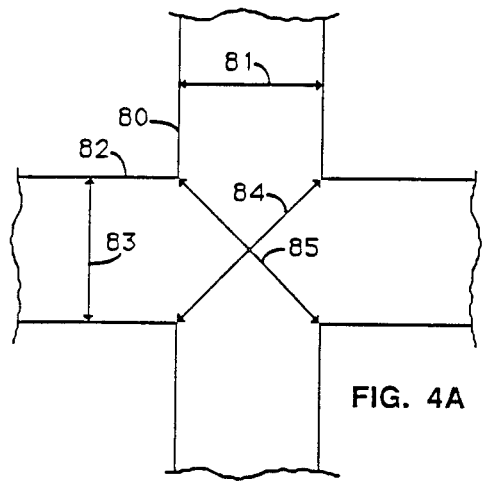
FIGS. 4A–C show simplified plan views of trench intersections

Those of skill in the art will also understand based on the description herein (see FIGS. 4A–C), that where multiple trenches intersect in the surface of the substrate that the lateral diagonal width of the intersection will be greater than the lateral width of either of the intersecting trenches. For example (see FIG. 4A), if two trenches 80, 82 of equal width 81, 83 intersect at right angles, the lateral diagonals 84, 85 (measured parallel to the plane of the substrate surface) will be about $(2)^{\frac{1}{2}}$ times the individual trench widths 80, 82.

Figure 4B:
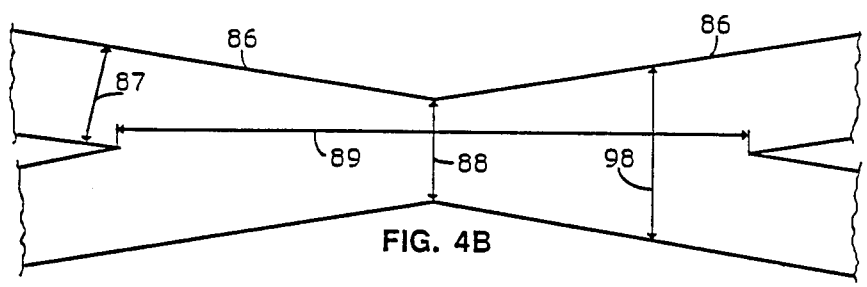
Figure 4C:
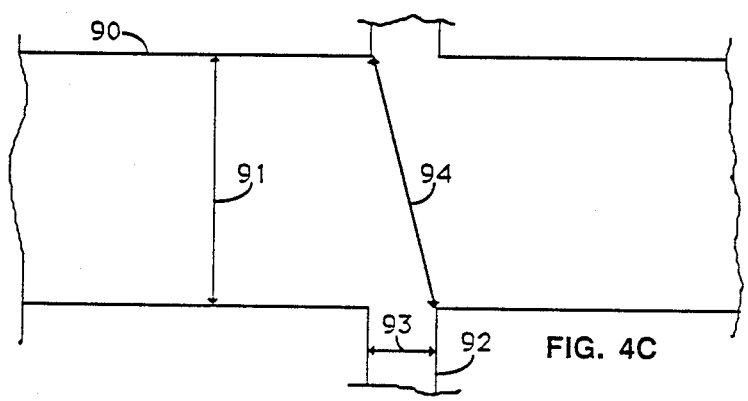

Those of skill in the art will also understand that if the trenches intersect at other than right angles or if one intersecting trench is larger than the other, then the diagonal will determine the effective width of the intersection. FIG. 4B illustrates the situation where two trenches 86 of equal width 87 intersect at an oblique angle. Both diagonals 88, 89 are longer than trench width 87. Filling will be determined approximately by distance 98 which is intermediate between diagonals 88, 89. FIG. 4C illustrates the situation when trenches 90, 92 of different widths 91, 93 intersect at right angles. Diagonal 94 is longer than either width 91, 93 and will determine when filling of the intersection is complete. The length of distances 84, 85, 94, or 98 can be easily calculated based on the widths of the intersecting trenches and the angle of intersection.

Intersections of the narrower trenches will be automatically filled by the multiple layers used for filling the wider trenches. However, there may be incomplete filling of the intersections of the widest trench or trenches. Cap layer 57 is advantageously utilized to fill in any gaps or depressions which might otherwise be present at the center of the diagonals of the widest trench intersections. Cap layer 57 is desirably made thicker than the other individual layers in the trenches. Because the intersections have already been mostly filled by the preceding layers and because the preceding layers inevitably provide some planarization and smoothing of corners and edges, any gap remaining in the largest intersections is usually in the form of a mild depression rather than a narrow slot. As cap layer 57 forms, it fills this remaining depression in the largest intersections predominantly by growing upward from the bottom of the depression rather than predominantly inwardly from the sides. Thus, cap layer 57 generally does not have an etch sensitive central joint.

Following deposition of a sufficient number of layer pairs and a cap layer to insure complete filling of the widest trench and trench intersection, such as is illustrated in FIG. 2 for a three trench arrangement, the structure is subjected to a planarizing etch to remove the portions of the deposited layers which lie above surface 41 of substrate 38 while leaving in place the portions of the dielectric layers located below surface 41 in trenches 40, 44, 48. It is desirable but not essential to add a non-conformal planarizing layer (not shown), such as for example a photoresist or polyimide layer, prior to the planarization etch. After planarization, one obtains a structure with a substantially planar upper surface (see FIG. 3). Planarization methods and materials are well known in the art.

FIG. 3 also illustrates a further embodiment of the present invention wherein thin sub-layer 80, 81 of thickness 82 is formed on surface 41 and on the walls of trenches 40, 44, 48. Silicon dioxide is an example of a suitable material for sub-layer 80, 81, but other dielectric materials can also be used. Those of skill in the art will appreciate based on the description herein that thickness 82 of layer 80, 81 is taken into account in determining the thickness of layers 51–56 and the like required to fill the various trenches in the substrate. Layer 80, 81 is desirable but not essential.

Figure 5:
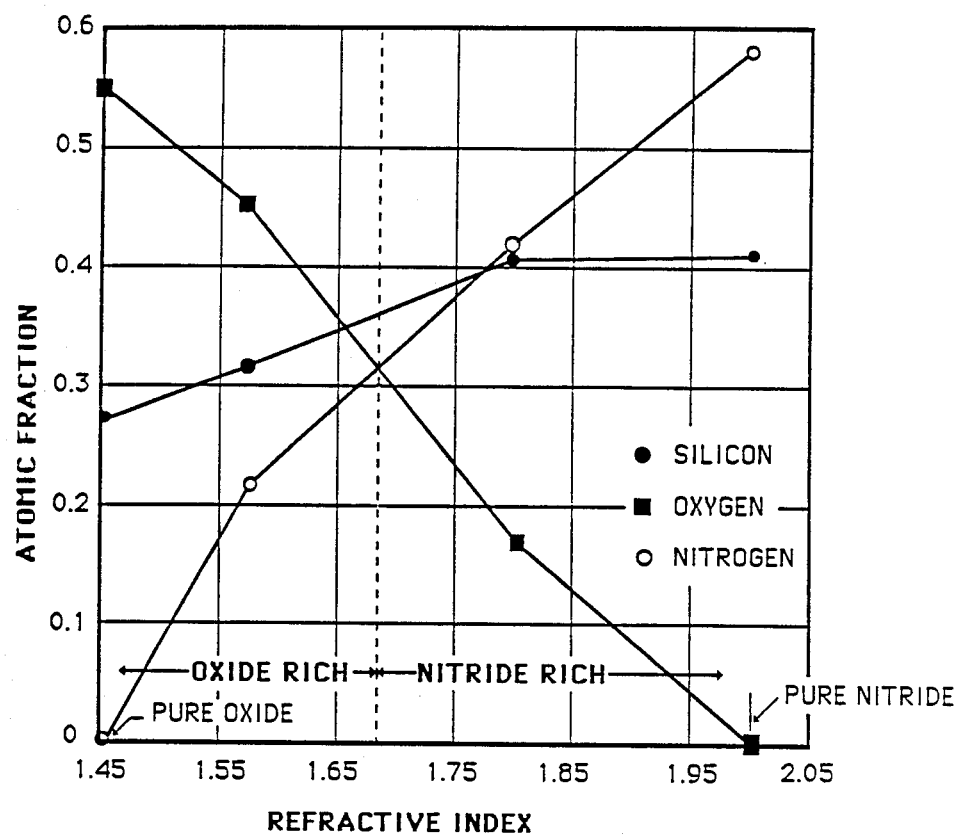
FIG. 5 shows the relationship between silicon, oxygen and nitrogen concentration in several oxy-nitride layers, expressed in atomic fraction, and the measured refractive index for those layers.
Figure 6:
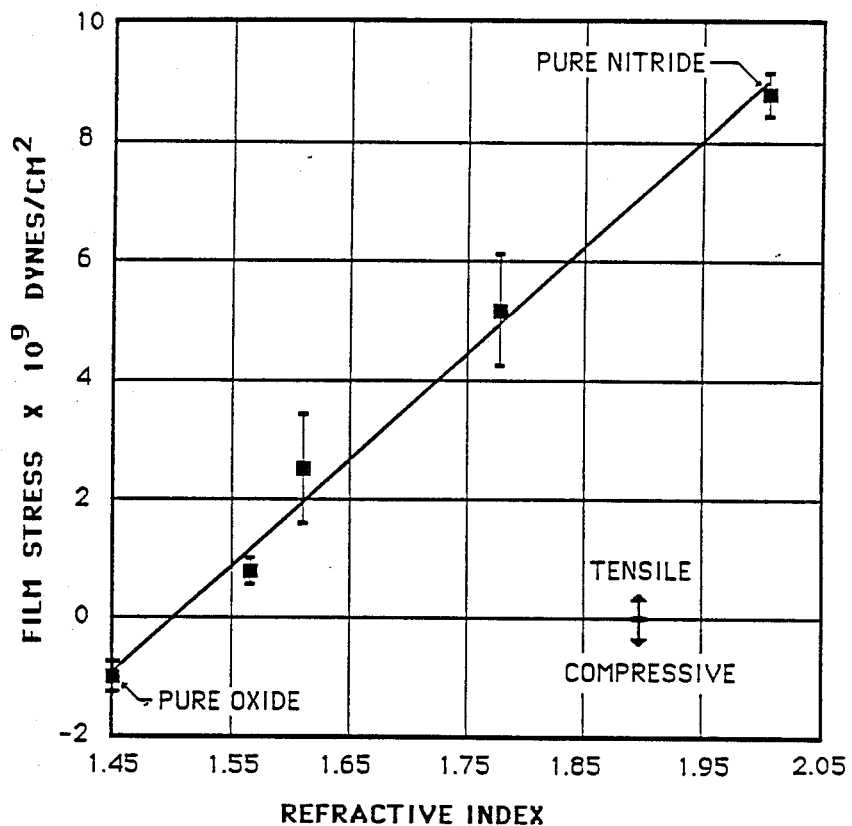
FIG. 6 shows the relationship between the stress in different oxy-nitride layers on silicon as a function of the refractive index of the different oxy-nitride layer.

Silicon oxy-nitride is a particularly desirable material for filling isolation trenches because its differential thermal expansion relative to the substrate can be controlled by selecting the composition of the material, that is, by controlling the oxygen-nitrogen ratio in the material. The variation of the index of refraction of silicon oxy-nitride layers with layer composition and the variation of stress in silicon oxy-nitride layers as a function of the index of refraction are shown in FIGS. 5 and 6, respectively. Also, silicon oxy-nitride is differentially etchable with respect to most semiconductor substrates, e.g., silicon, germanium, III–V's etc.

It has been found that isolation trenches having superior properties are formed by the layered structure described above where the odd numbered layers, that is the first, third, fifth, etc., layers (51, 53, 55, . . . ) are oxygen rich silicon oxy-nitride and the even numbered layers, that is, the second, fourth, sixth, etc., layers (52, 54, 56, . . . ) are silicon nitride or nitrogen rich silicon oxy-nitride. The cap layer can be of oxide, nitride, oxy-nitride or other materials. Where silicon substrates are used, as in the example described below, an oxygen rich oxy-nitride is the preferred materal for the cap layer because it can provide lower differential thermal expansion stress relative to silicon. The relationship between the stress in an oxy-nitride layer on a silicon substrate, expressed in dynes/cm$^2$, is shown in FIG. 6 for oxy-nitride layers of different refractive index. The relationship between composition and refractive index is shown in FIG. 5.

The oxygen rich oxy-nitride layers are generally thicker than the nitride or nitrogen rich oxy-nitride layers. The composition and thickness of the oxygen rich layers are adjusted to provide the proper overall average coefficient of expansion for the multilayered filler material relative to the substrate.

Unlike silicon dioxide or oxygen rich oxy-nitride material, the nitride rich oxy-nitride material provides a less etch sensitive joint or seam, for example at locations 72, 74, 76 where the trench filling material closes on itself. In general, the higher the nitrogen content of the oxy-nitride, the lower the etch sensitivity for etchants that attack oxide. Thus, the laminated trench filling of the present invention simultaneously provides isolation walls of different widths in the same substrate that have (i) a predetermined desired coefficient of expansion relative to the substrate, (ii) a seam-free, gap-free, etch resistant surface and core, and (iii) a substantially planar surface. Further, as will be subsequently explained, the multilayered filling may be formed in a single reactor by varying the reactant gas composition during layer deposition. This is a substantial manufacturing advantage.

EXAMPLE

Conventional silicon wafers were etched using standard techniques well known in the art to form trenches having nominal widths of 0.5, 1.0, and 1.5 micrometers and a depth of about 1 to 6 micrometers. Thus the aspect ratio of the trenches was in the range of about 1–10 (height/width). The trenches shown in FIGS. 1–3 are idealized and simplified with straight sidewalls and square corners. Generally, real trenches have somewhat rounded corners and sidewalls that tilt or curve outward from the vertical with a slight outward taper so that the trench width is greater in the upper half of the trench toward the substrate surface. Accordingly, the trench widths were determined at the widest point in the trench so that the deposited layer thicknesses would be sufficient to insure filling of the widest point in the trench.

In some samples, a silicon oxide sub-layer of about 0.01 micrometers thickness was thermally grown on the wafer surface and on the trench walls. This sub-layer is useful for avoiding inversion problems but not essential. An equivalent layer may be obtained by making the initial deposition of the first oxy-nitride layer especially oxygen rich, i.e., little or no nitrogen source gas in the reactor until about 0.01 micrometers of almost pure oxide are formed, and then continuing at the preferred oxy-nitride concentration.

A first oxygen rich oxy-nitride layer about 0.15 micrometers thick was conformally deposited on the substrate surface and on the trench walls, including the sidewalls and the bottom walls of the trenches (or the oxide sub-layer when used), by means of a LPCVD reactor. A nitride LPCVD reactor manufactured by Tylan, Inc. of Carson, CA was used at about 850°–900° C. and a pressure of about 500–600 millitorr, and with $N_2O$, $NH_3$, and $SiH_2Cl_2$ as the reactant gases in the ratio about 9:1:1, respectively, by volume. This produced an oxy-nitride layer having a refractive index of about 1.75.

Following deposition of the first layer, a second nitrogen rich oxy-nitride layer of at least about 0.1 micrometers thickness was deposited on the first layer in the same reactor and without removing the wafers by changing the deposition conditions to about 825°–875° C. and a pressure of about 500–550 millitorr, and with $N_2O$, $NH_3$, and $SiH_2Cl_2$ as the reactant gases in the ratio about 5:5:1, respectively, by volume. This produced an oxy-nitride layer having a refractive index of about 1.81.

The combination of a 0.15 micrometer thick first layer plus a 0.1 micrometer thick second layer is just sufficient to fill a 0.5 micrometer wide trench, i.e., the narrowest trench in this case. Thus, the narrowest trench has a two layer filling, a first oxide rich layer and a second nitride rich layer. A small excess layer thickness is desirable, either by way of the 0.01 micrometer sub-layer or by slightly increasing the thickness of one or both of the first and/or second layers to insure complete filling.

Where further layers are deposited to also fill wider trenches, there is no need to be concerned about the intersections of the narrowest trenches since they will, perforce, be filled in the process of filling the wider trenches.

Third and fourth layers corresponding in composition and thickness substantially to the first and second layers, respectively, were then deposited. The third and fourth layers add to the height of the layers above the 0.5 micrometer wide trenches, insure that any intersections of the narrow trenches are filled, and fill the next wider (1.0 micrometer) trenches in the same way that the first and second layers fill the narrower trenches. The 1.0 micrometer wide trenches thus have a four layer filling.

Fifth and sixth layers corresponding in composition and thickness substantially to the first and second layers, respectively, were then deposited. The fifth and sixth layers add to the height of the layers above the 0.5 and 1.0 micrometer wide trenches, insure that any intersections of these trenches are filled, and fill the next wider (1.5 micrometer) trenches in the same way that the first and second layers, and first, second, third and fourth layers fill the narrower trenches. The 1.5 micrometer wide trenches thus have a six layer filling. If there are still wider trenches or if filling is incomplete, additional layer pairs are provided.

In order to fill any gaps or recesses in the wider trench intersections a cap layer of at least about 0.3 and typically about 0.7 micrometers thickness of oxygen or nitrogen rich oxy-nitride (typically oxygen rich) was deposited over the sixth layer. A planarizing layer of photoresist was applied and the combination subjected to a planarizing etch in a Type 8110 reactor manufactured by Applied Materials, Inc. of Santa Clara, CA at about 50–60 millitorr pressure and about 1000–1200 watts, using reactant gases comprising $CHF_3$ and $O_2$ in the proportions of about 3.4:1, respectively. These etching conditions gave etch rates ratios of about 4.7 for pure nitride, relative to about 3.6 for the above described oxygen rich oxy-nitride, and relative to about 1.0 for the photoresist. Etch rate ratios for the nitrogen rich oxy-nitride were intermediate between the relative etch rates of the oxygen rich oxy-nitride and the pure nitride.

After planarization, the finished devices are similar to FIG. 3, but with slightly rounded shapes at the trench corners, trench walls and the like and some unevenness in the surface due the differences between ideal and actual trench shapes and to residual differences in relative etch rates of the different materials during planarization.

FIG. 5 shows a plot of the oxy-nitride layer chemistry in terms of the atomic fraction of silicon, oxygen, and nitrogen in the $Si_xO_yN_z$ oxy-nitride layers versus the refractive index of the layers. The oxy-nitride layer composition was determined by Auger measurements using a Type PHI-590 Auger spectrometer manufactured by Perkin-Elmer of Eden Prairie, MN on oxy-nitride layers of varying composition on silicon wafers. The refractive index was determined by use of a Type 11115 Bellipsometer manufactured by Gaertner, Inc. of Chicago, IL on the same layers. Such measurement techniques are well known in the art.

Where the oxy-nitride composition is expressed as $Si_xO_yN_z$ with x, y, and z being atomic fractions, the oxygen rich oxy-nitride material has the ratio y/z greater than one and less than infinity and the nitrogen rich oxy-nitride material has the ratio z/y greater than one and less than infinity. A stoichiometric oxy-nitride layer is defined for the purposes of this invention as an oxy-nitride material having y/z=1, i.e., y=z. This corresponds to a refractive index of about 1.68. A pure oxide layer corresponds to z=0 and a pure nitride layer to y=0. An oxygen rich oxy-nitride layer has a refractive index between 1.45 (pure oxide) and about 1.68 (stoichiometry). A nitrogen rich oxy-nitride layer has a refractive index between about 1.68 (stoichiometry) and 2.01 (pure nitride). The relationship between the stress in the oxy-nitride layer (relative, for example, to silicon), and the refractive index of the oxy-nitride layers is shown in FIG. 6.

It is desirable that the oxygen rich oxy-nitride has about x=0.25–0.4, y=0.27–0.6, and z=0.0–0.35 and the nitrogen rich oxy-nitride has about x=0.34–0.43, y=0.0–0.35 and z=0.28–0.6, expressed in atomic fractions. While it is believed that the stoichiometric point (y=z) of the oxy-nitride occurs where the oxygen and nitrogen lines cross on FIG. 5 at a refractive index of about 1.68, those of skill in the art will appreciate that because of experimental uncertainty in the composition measurements and the spacing of the data points some uncertainty occurs in the exact location of the crossover where oxygen and nitrogen are present in equal amounts. Thus, the transition from oxygen rich to nitrogen rich is believed to occur over a range of refractive index around the value of 1.68, rather than exactly at 1.68. Accordingly, some overlap is provided in the above noted composition ranges for the oxygen rich and the nitrogen rich oxy-nitride near the value where y and z are estimated to be equal, i.e., where the oxygen and nitrogen lines cross. It is preferable that the oxygen rich oxy-nitride has about x=0.3–0.35, y=0.4–0.5, and z=0.10–0.25 and the nitrogen rich oxy-nitride also has about x=0.38–0.41, y=0.13–0.23 and z=0.32–0.46, expressed in atomic fractions and where $x+y+z=1$.

In terms of the refractive index of the oxy-nitride layers, it is desirable that the oxygen rich oxy-nitride has a refractive index in the range of about 1.45–1.68 and the nitrogen rich oxy-nitride desirably has a refractive index in the range of about 1.68–2.01, preferably in the range of about 1.5–1.65 for the oxygen rich oxy-nitride and about 1.7–1.85 for the nitrogen rich oxy-nitride.

Multilayered structures such as have been previously described were studied by performing Auger measurements while sputtering through the multiple oxy-nitride layers. In this manner, the composition changes as a function of depth through the layers expected as a result of the gas composition changes during deposition could be verified. The as-deposited layers showed changes in composition over thicknesses of the order of a few hundredths of a micrometer or less, corresponding to what was expected from altering the source gases during layer deposition. This indicates that there was negligible solid state diffusion or mixing of the oxy-nitride layer constituents after deposition as between the oxygen rich and nitrogen rich layers.

The average stress in the oxy-nitride layer relative to the substrate is determined by determining the contribution of each differing layer of oxy-nitride taking into account its composition and thickness.

By providing layered oxy-nitride structures according to the above-described means and method, it was found that dielectric filled isolation trenches were obtained having superior properties. The above-described method is particularly economical and convenient. In particular, the oxy-nitride layer properties can be adjusted by varying the oxy-nitride composition and the stress relative to the substrate can be minimized by using an oxygen rich oxy-nitride for the bulk of the trench refill. The formation of central crevices or etch cracks in the material used to fill the trenches is avoided by using a nitrogen rich oxy-nitride layer where the trench filling closes on itself. Trenches and intersections of multiple width are accommodated by using a succession of oxy-nitride layer pairs which are multiples of the layer thicknesses needed for the narrowest isolation walls, plus a cap layer of similar materials to fill any depressions associated with the largest trench intersections. Further, the oxy-nitride material layers of differing composition are formed in a single reactor by adjusting the deposition gases during layer formation. There is little if any compositional smearing of the layers after deposition. Additionally, the present means and method allows these and other advantages to be achieved simultaneously.

Those of skill in the art will appreciate, based on the description herein, that (i) other substrates besides silicon may be used, and that (ii) other dielectric materials besides oxy-nitrides may be used, provided that they are differentially etchable with respect to the substrate, have thermal coefficients of expansion relative to the substrate which vary in the desired way with composition, and provided that at least in one range of composition the substitute dielectric material forms an etch insensitive joint where the surfaces of the growing dielectric layers meet in the trenches during deposition. Accordingly, it is intended to incorporate in the claims which follow, these and other variations that will occur to those of skill in the art based on the teachings herein.

We claim:

1. An electronic device having dielectric filled trenches, comprising
   a substrate having a semiconductor surface;
   multiple trenches in the substrate comprising, a first trench having a first width and, at least a second trench having a second width larger than first width, wherein trenches have sidewalls extending from the surface into the substrate and bottoms separated from the surface; and
   multiple dielectric layer pairs of alternating composition and etch rate on the sidewalls and bottom, of at least the second trench, including odd-numbered layers of oxygen rich oxy-nitride and even-numbered layers of nitrogen rich oxy-nitride each oxy-nitride layer being thicker than a natural oxy-nitride interfacial layer formed between superposed silicon oxide and silicon nitride.

2. The device of claim 1 wherein the even-numbered layers are thinner than the odd-numbered layers, and each successive layer in the trench completely covers the proceeding layer in the trench.

3. The process of claim 1 wherein the oxygen rich oxy-nitride has a composition $Si_xO_yN_z$, where x,y, and z are in the range $x=0.25-0.40$, $y=0.26-0.6$, and z is greater than zero to 0.35, and wherein $x+y+z=1.0$.

4. The process of claim 1 wherein the nitrogen rich oxy-nitride has a composition $Si_pO_qN_r$, where p,q, and r are in the range $p=0.34-0.43$, is greater than zero to 0.35, and $r=0.28-0.6$, and wherein $p+q+r=1.0$.

5. The device of claim 3 wherein the oxygen rich oxy-nitride has a composition $Si_xO_yN_z$, where x, y, and z are about $x=0.3-0.35$, $y=0.4-0.5$, and $z=0.10-0.25$.

6. The device of claim 4 wherein the nitrogen rich oxy-nitride has a composition $Si_pO_qN_r$, p, q, and r are about $p=0.38-0.41$, $q=0.13-0.23$, and $r=0.32-0.46$.

7. A dielectric filled trench for lateral isolation of semiconductor devices comprising:
   a semiconductor substrate having at least one trench ecxtending therein; and
   a dielectric filing in the trench comprising multiple alternate layers of oxygen rich silicon oxy-nitride and nitrogen rich silicon oxy-nitride wherein each oxy-nitride layer is thicker than a naturally formed interfacial oxy-nitride layer between superposed silicon oxide silicon nitride.

8. The trench of claim 7 wherein the oxygen rich oxy-nitride has a refractive index about in the range 1.45-1.68 and the nitrogen rich oxy-nitride has a refractive index about in the range 1.68-2.01.

9. The trench of claim 7 wherein the oxygen rich oxy-nitride has a composition $Si_xO_yN_z$, where x, y, and z are about $x=0.3-0.35$, $y=0.4-0.5$, and $z=0.10-0.25$, and the nitrogen rich oxy-nitride has a composition $Si_pO_qN_r$, p, q, and r are about $p=0.38-0.41$, $q=0.13-0.23$, and $r=0.32-0.46$.

10. A dielectric filled trench for semiconductor devices comprising:
    a semiconductor substrate having trenches therein of at least two widths, a first narrower trench and a second wider trench;
    a dielectric filling in the wider trench comprising at least two layers of oxygen rich silicon oxy-nitride alternating with at least two layers of nitrogen rich silicon oxy-nitride.

11. A dielectric filled trench for lateral isolation of semiconductor devices comprising:
    a semiconductor substrate having at least two trenches, a first narrower trench and a second wider trench;
    a dielectric filling in the trenches wherein the filling in the narrower trench comprises a first sandwich of an oxygen rich silicon oxy-nitride layer and a nitrogen rich silicon oxy-nitride layerm and the filling in the wider trench comprises the first sandwich plus a second sandwich which repeats the first sandwich an integral number of times.

12. An electronic device having dielectric filled trenches, comprising
    a substrate having a semiconductor surface;
    multiple trenches in the substrate comprising, a first trench having a first width and, at least a second trench having a second width larger than the first width, wherein the trenches have sidewalls extending from the surface into the substrate and bottoms separated from the surface; and
    multiple dielectric layer pairs of alternating composition and etch rate on the sidewalls and bottom, of at least the second trench, including odd-numbered layers of oxygen rich oxy-nitride and even-numbered layers of nitrogen rich oxy-nitride, each oxy-nitride layer being thicker than a natural oxy-nitride interfacial layer formed between superposed silicon oxide and silicon nitride, wherein the composition within individual dielectric layers is substantially uniform.

13. The device of claim 1 further comprising on the sidewalls and bottom, a thin base layer of silicon axide.

14. The device of claim 1 further comprising a further layer of oxygen rich silicon oxy-nitride on the multiple layers.

15. An electronic device having dielectric filled trenches, comprising:
    a substrate having a surface;
    multiple trenches extending from the substrate and comprising a first trench having a first width and at least a second trench having a second width larger than the first width; and
    alternating dielectric layers at least partially filling the trenches and comprising at least two layers in the first trench and at least four layers in the second trench, wherein odd-numbered layers have a first composition and a first etch rate and even-numbered layers have a second composition different than the first composition and a second etch rate different than the first etch rate, wherein each layer is thicker than a dielectric layer formed from a native oxide.

16. The device of claim 15 wherein the alternating dielectric layers comprise odd-numbered layers of an oxygen rich silicon oxy-nitride and even-numbered layers of a nitrogen rich silicon nitride, and wherein the successive layers within each trench completely cover the proceeding layers.

17. The device of claim 15 further comprising a thin base layer of silicon oxide under the alternating dielectric layers.

18. The device of claim 17 wherein the odd-numbered layers are substanitially thicker than the thin base layer.

19. An electronic device having dielectric filled trenches, comprising:
a substrate having a surface;
multiple trenches extending from the surface into the substrate and comprising a first trench having a first width and at least a second trench having a second width larger than the first width; and
alternating dielectric layers at least partially filling the trenches and comprising at least two layers in the first trench and at least four layers in the second trench, wherein odd-numbered layers have a first composition and a first etch rate and even-numbered layers have a second composition different than the first composition and a second etch rate different that the first etch rate, wherein each layer is thicker than a dielectric layer formed from a native oxide, and wherein the even-numbered layers are of substantially equal thickness.

20. An electronic device having dielectric filled trenches, comprising:
a substrate having a surface;
multiple trenches extending from the surface into the substrate and comprising a first trench having a first width and at least a second trench having a second width larger than the first width; and
alternating dielectric layers at least partially filling the trenches and comprising at least two layers in the first trench and at least four layers in the second trench, wherein odd-numbered layers have a first composition and a first etch rate and even-numbered layers have a second composition different than the first composition and a second etch rate different that the first etch rate, wherein each layer is thicker than a dielectric layer formed from a native oxide, and wherein the odd-numbered layers are of substantially equal thickness.

21. The device of claim 15 wherein the odd-numbered layers are thicker than the even-numbered layers.

22. The device of claim 15 further comprising a further layer of oxygen rich silicon oxy-nitride on the outermost layer.

* * * * *